(12) United States Patent
Jeon et al.

(10) Patent No.: US 9,082,900 B2
(45) Date of Patent: Jul. 14, 2015

(54) PHOTOVOLTAIC MODULE AND MANUFACTURING METHOD THEREOF

(75) Inventors: Sang-Won Jeon, Chungcheongbuk-do (KR); Nam-Kyoon Kim, Chungcheongbuk-do (KR)

(73) Assignee: Intellectual Discovery Co., Ltd., Seoul (KR)

( * ) Notice: Subject to any disclaimer, the term of this patent is extended or adjusted under 35 U.S.C. 154(b) by 0 days.

(21) Appl. No.: 13/520,317

(22) PCT Filed: Mar. 11, 2011

(86) PCT No.: PCT/KR2011/001717
§ 371 (c)(1),
(2), (4) Date: May 11, 2015

(87) PCT Pub. No.: WO2012/124834
PCT Pub. Date: Sep. 20, 2012

(65) Prior Publication Data
US 2013/0008498 A1   Jan. 10, 2013

(30) Foreign Application Priority Data

Mar. 11, 2011 (KR) .......................... 10-20110021609

(51) Int. Cl.
  H01L 31/02   (2006.01)
  H01L 31/0216 (2014.01)
  H01L 31/0224 (2006.01)
  H01L 31/0232 (2014.01)
  H01L 31/056  (2014.01)

(52) U.S. Cl.
  CPC .... *H01L 31/02167* (2013.01); *H01L 31/02327* (2013.01); *H01L 31/022466* (2013.01); *H01L 31/056* (2014.12); *Y02B 10/12* (2013.01); *Y02E 10/52* (2013.01)

(58) Field of Classification Search
  CPC ....................................................... H01L 31/02
  USPC .................................................. 136/256, 259
  See application file for complete search history.

(56) References Cited

U.S. PATENT DOCUMENTS

2010/0037948 A1   2/2010  Hwang et al.
2011/0023934 A1*  2/2011  Xue et al. .................... 136/245

FOREIGN PATENT DOCUMENTS

| JP | 2005-050928 | 2/2005 |
| JP | 2007-103813 | 4/2007 |
| JP | 2010-045368 | 2/2010 |
| JP | 2010-199555 | 9/2010 |
| JP | 2011-014559 | 1/2011 |
| JP | 2011-501439 | 1/2011 |
| KR | 10-2007-0097532 | 10/2007 |
| KR | 1020100021347 | 2/2010 |
| KR | 1020110021362 | 3/2011 |
| KR | 10-2011-0139948 | 12/2011 |
| WO | 2009/055223 | 4/2009 |

* cited by examiner

*Primary Examiner* — Susan D Leong
(74) *Attorney, Agent, or Firm* — H.C. Park & Associates, PLC

(57) ABSTRACT

Disclosed herein is a photovoltaic module including: a first electrode formed on a substrate; a photoelectric conversion layer formed on the first electrode; a second electrode formed on the photoelectric conversion layer; and a light transmitting back substrate disposed over the second electrode. The photovoltaic module has a color within a range of a*: −25~0, b*: 10~50, L*: 20~50 in Commission Internationale de l'Eclairage (CIE) LAB color coordinate.

9 Claims, 8 Drawing Sheets

PHOTOVOLTAIC MODULE AND MANUFACTURING METHOD THEREOF

CROSS-REFERENCE TO RELATED PATENT APPLICATIONS

The present application is a U.S. national stage application under 35 U.S.C. §371 of PCT Application No. PCT/KR2011/001717, filed Mar. 11, 2011, which claims priority to Korean Patent Application No. 10-2011-0021609, filed Mar. 11, 2011, the entireties of which are incorporated herein by reference.

BACKGROUND

1. Field of the Invention

The present invention relates to a photovoltaic module and a manufacturing method thereof.

2. Description of Related Art

Recently, as existing energy resources like oil and coal and the like are expected to be exhausted, much attention is increasingly paid to alternative energy sources which can be used in place of the existing energy sources. In the alternative energy sources, solar energy is abundant and has no environmental pollution. Therefore, more and more attention is paid to the solar energy. The solar energy is used in the form of solar heat energy and sunlight energy. The solar heat energy is used to generate steam for rotating a turbine by using solar heat. The sunlight energy is used to convert photons into electrical energy by using a semiconductor property.

A photovoltaic module converting sunlight into electrical energy has a junction structure of a p-type semiconductor and an n-type semiconductor. When light is incident on the photovoltaic module, an electron with a negative electric charge and an electron-hole with a positive electric charge are generated by the interaction between the light and a material constituting the semiconductor of the photovoltaic module. Then, electric current flows while the electron and the electron-hole move.

This is referred to as a photovoltaic effect. Regarding the p-type and the n-type semiconductors, all of which constitute the photovoltaic module, an electron is attracted to the n-type semiconductor and moves to an electrode joined to the n-type semiconductor. An electron-hole is attracted to p-type semiconductor and moves to an electrode joined to the p-type semiconductor. Then, electricity flows outward through the connection between the electrodes by wires.

The photovoltaic module is used for buildings as well as electric-power generation. The building integrated photovoltaic module is installed on the roof, wall or window of a building and generates electric power. The building integrated photovoltaic module is required to have various other features as compared with the electric power generation photovoltaic module. Therefore, many researches are devoted to the building integrated photovoltaic module.

The commercially used building integrated photovoltaic module has a dark black color or, in many cases, has a reddish brown color or an orange color. When the building integrated photovoltaic module is installed on the window of a building, visual fatigue may be easily caused. The building integrated photovoltaic module also degrades aesthetics and does not achieve total harmony well with the building.

Hence, a photovoltaic module is urgently required, which is capable of generating electrical energy by receiving sunlight, of reducing fatigue caused by the installation thereof to a building and of aesthetically achieving harmony with the building.

SUMMARY

An aspect of the present invention is a photovoltaic module. The photovoltaic module includes: a first electrode formed on a substrate; a photoelectric conversion layer formed on the first electrode; a second electrode formed on the photoelectric conversion layer; and a light transmitting back substrate disposed over the second electrode. The photovoltaic module has a color within a range of $a^*$: $-25\sim 0$, $b^*$: $10\sim 50$, $L^*$: $20\sim 50$ in Commission Internationale de l'Eclairage (CIE) LAB color coordinate.

Another aspect of the present invention is a photovoltaic module. The photovoltaic module includes: a first electrode formed on a substrate; a photoelectric conversion layer formed on the first electrode; a second electrode formed on the photoelectric conversion layer; an insulating protective layer formed on the second electrode; a light transmittance back substrate disposed on the insulating protective layer; and an optical layer being formed at least one of under the substrate, between the substrate and the first electrode, between the second electrode and the insulating protective layer, between the insulating protective layer and the back substrate, and on the back substrate, and showing a color.

DETAILED DESCRIPTION

Hereafter, a photovoltaic module according to an embodiment of the present invention will be described with reference to the accompanying drawings.

Configuration of the Photovoltaic Module

FIGS. 1 to 5 are views showing a configuration of a photovoltaic module according to an embodiment of the present invention.

Figure 1:
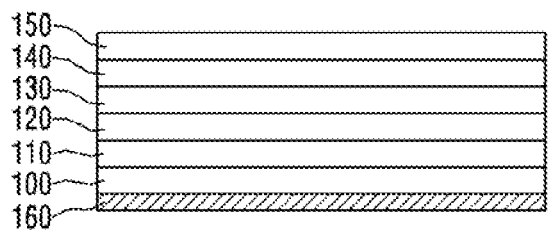
FIGS. 1 to 5 are views showing a configuration of a photovoltaic module according to an embodiment of the present invention.
Figure 2:
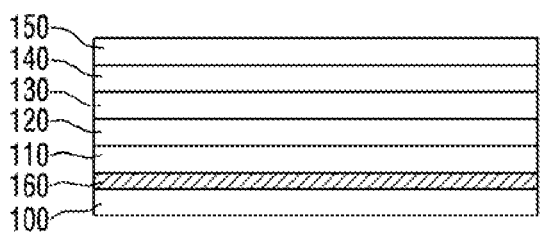
Figure 3:
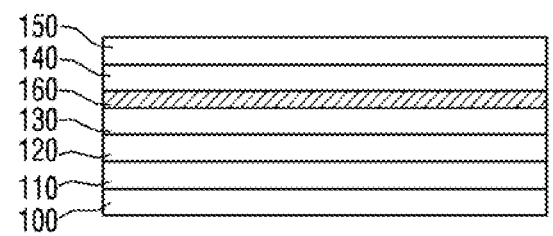
Figure 4:
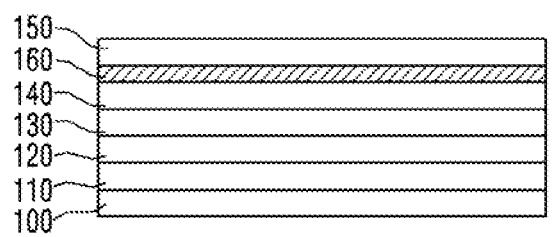
Figure 5:
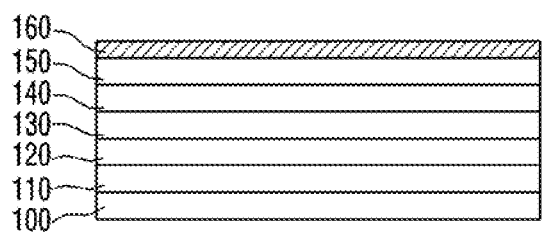

Referring to FIGS. 1 to 5, the photovoltaic module of the present invention may include a first electrode 110, a photoelectric conversion layer 120 and a second electrode 130, all of which are sequentially stacked on a substrate 100. An insulating protective layer 140 and a back substrate 150 may be further included on the second electrode 130. The photovoltaic module according to an embodiment of the present invention includes an optical layer 160 in at least one portion thereof. The optical layer 160 may be included in a random position of the photovoltaic module. For example, the optical layer 160 may be, as shown in FIG. 1, formed under the substrate 100, or may be, as shown in FIG. 2, formed between the substrate 100 and the first electrode 110. The optical layer 160 may be also, as shown in FIG. 3, formed between the second electrode 130 and the insulating protective layer 140. Also, as shown in FIG. 4, the optical layer 160 may be formed between the insulating protective layer 140 and the back substrate 150, or may be, as shown in FIG. 5, formed on the back substrate 150. The optical layer 160 may be also formed in at least two positions out of the positions shown in FIGS. 1 to 5.

The optical layer 160 according to the embodiment of the present invention is a component allowing the entire photovoltaic module to have a color. The optical layer 160 is formed by dissolving a coloring pigment or dye in a common solvent. The optical layer 160 may be, for example, a coating layer. When a solution including a coloring pigment or dye which possesses a certain percentage of the solution is applied on the back substrate 150, the optical layer 160 can be formed on the back substrate 150. For example, the pigment or dye may be included in the solvent and have about 5 to 40 weight percent.

Figure 6:
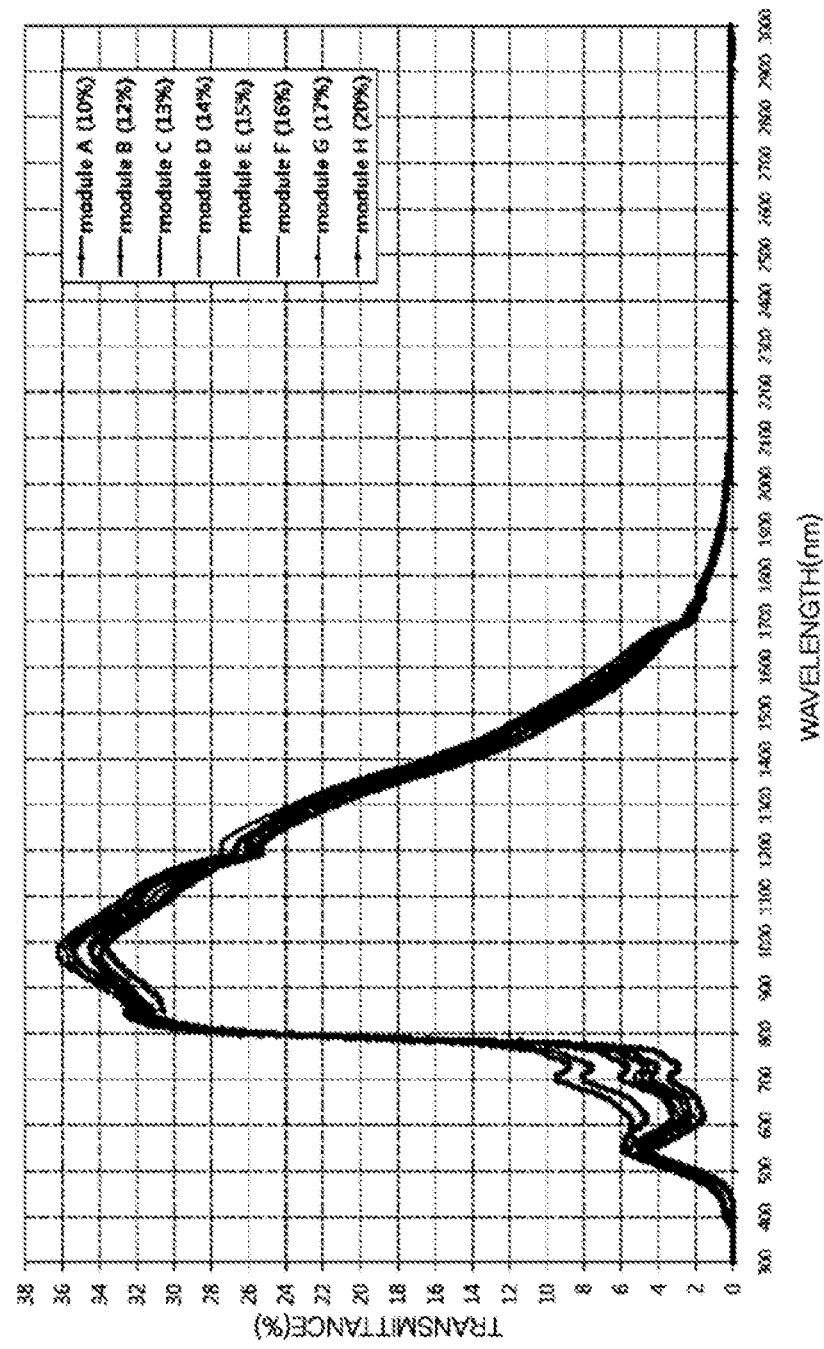
FIG. 6 is a graph showing a transmittance of an optical layer according to the embodiment of the present invention.
Figure 7:
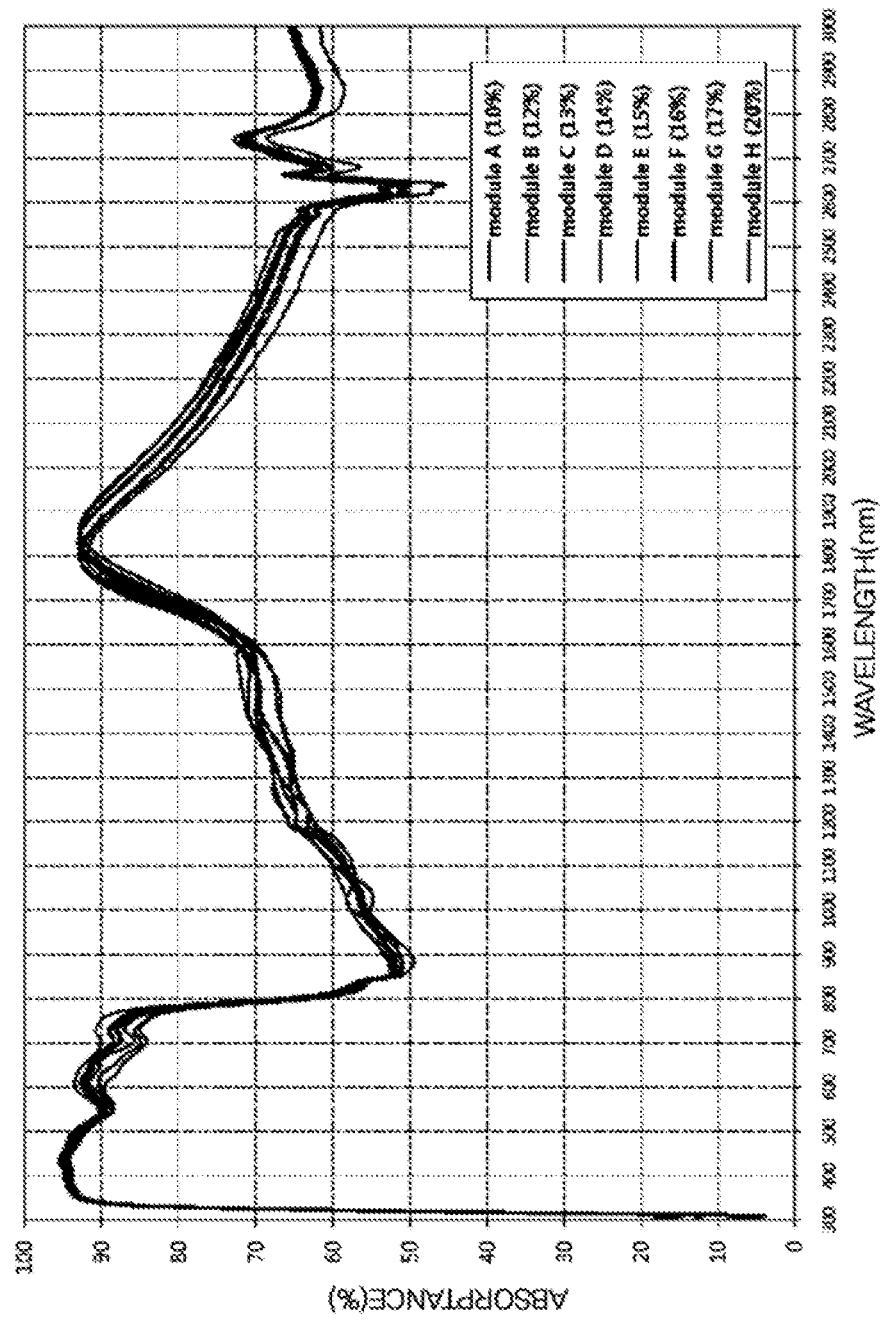
FIG. 7 is a graph showing an absorptance of the optical layer according to the embodiment of the present invention.

FIGS. 6 and 7 are graphs showing respectively a transmittance and an absorptance for each wavelength of the optical layer 160 according to the embodiment of the present invention.

Meanwhile, the following Table 1 shows a transmittance, a reflectance and an absorptance for each wavelength of the optical layer 160 according to the embodiment of the present invention.

A transmittance, reflectance and absorptance of the back substrate 150 on which the optical layer 160 has been formed on one of both sides thereof have been measured. For comparison, the transmittance, reflectance and absorptance of the back substrate 150 having no optical layer 160 formed thereon have been also measured.

When the substrate 100 includes the metal foil, the substrate 100 may include an insulation layer (not shown) covering the metal foil.

The first electrode 110 according to the embodiment of the present invention may be formed of a conductive material. For example, the first electrode 110 may be a transparent conductive oxide (TCO). The transparent conductive oxide may be formed of a material including $SnO_2$:F, ZnO:B and ZnO:Al and the like.

The photoelectric conversion layer 120 according to the embodiment of the present invention may include one of an amorphous photoelectric conversion layer, a crystalline photoelectric conversion layer, a compound photoelectric conversion layer and an organic photoelectric conversion layer. The compound photoelectric conversion layer may include a group compound semiconductor, a group II-VI compound semiconductor or a group III-V compound semiconductor. The amorphous photoelectric conversion layer includes a silicon layer which is not doped with impurity and is located between silicon layers which have been doped with group III impurity or group V impurity. Meanwhile, a solar cell including the first electrode 110, the photoelectric conversion layer 120 and the second electrode 130 according to the embodiment of the present invention may be implemented by a CIGS solar cell, a CdTe solar cell, a dye-sensitized solar cell and an organic thin film solar cell. Hereafter, a case where the photoelectric conversion layer 120 is formed to include the amorphous photoelectric conversion layer will be taken as an example.

That is, for example, the photoelectric conversion layer 120 may be formed by sequentially stacking a p-type semiconductor layer, an intrinsic semiconductor layer and an n-type semiconductor layer. The p-type semiconductor layer, the intrinsic semiconductor layer and the n-type semiconduc-

TABLE 1

| | Near UV (300 nm~400 nm) | | | Visible light (400 nm~800 nm) | | | Near IR (780 nm~3000 nm) | | |
|---|---|---|---|---|---|---|---|---|---|
| | transmittance | reflectance | absorptance | transmittance | reflectance | absorptance | transmittance | reflectance | absorptance |
| transparent substrate | 55.2 | 18.9 | 25.9 | 87.3 | 6.1 | 6.6 | 73.2 | 8.5 | 18.4 |
| transparent substrate + optical layer (15%) | 11.3 | 16.8 | 71.9 | 38.5 | 4.2 | 57.3 | 76.0 | 8.5 | 15.4 |

In Table 1, "15%" represents a color depth of the optical layer 160 and means that a weight ratio of a pigment or dye to a solvent in a solution used as a material of the optical layer 160 is 15%.

Referring to Table 1 and FIG. 6, it can be found that the transmittance of the optical layer 160 is about 5% to 40% in the near UV region (300 nm~400 nm) and is about 50% to 80% in the near IR region (780 nm~3000 nm). Referring to Table 1 and FIG. 7, it can be found that the absorptance of the optical layer 160 is about 50% to 80% in the near UV region (300 nm~400 nm) and is about 10% to 25% in the near IR region (780 nm~3000 nm). In the embodiment of the present invention, any material capable of satisfying the characteristics mentioned above can be used as the optical layer 160.

The substrate 100 according to the embodiment of the present invention may be an insulating transparent substrate. The substrate 100 may be also an inflexible substrate like glass or a flexible substrate like polymer or metal foil. The substrate 100 may be formed of a material like plastic or glass.

tor layer may be stacked in reverse order. When the p-type semiconductor layer, the intrinsic semiconductor layer and the n-type semiconductor layer are stacked in the order specified, light may be incident through the substrate 100. When stacked in reverse order to the aforementioned order, light may be incident through the opposite side to the substrate 100. The p-type semiconductor layer may be an amorphous silicon layer which is represented by a chemical formula such as a-Si:H or a-SiC:H and the like. The p-type semiconductor layer may be formed by mixing source gas like $SiH_4$ which includes silicon, doping gas including a group III element like $B_2H_6$, and $H_2$ gas in a reaction chamber. Additionally, a p-type semiconductor layer which can be represented by a chemical formula of a-SiC:H including carbon may be obtained by further mixing $CH_4$ gas. The intrinsic semiconductor layer may be formed by introducing hydrogen gas and source gas including silicon into a reaction chamber. Additionally, the n-type semiconductor layer may be formed by mixing source gas includes silicon, doping gas including a group V element like $PH_3$, and $H_2$ gas.

The second electrode 130 according to the embodiment of the present invention may be formed of an opaque conductive material or a transparent conductive material. When the second electrode 130 is formed of the opaque conductive material (for example, aluminum or silver and the like), the second electrode 130 reflects again light which is incident on and transmits through the photovoltaic module without being used for photovoltaic conversion. As a result, photovoltaic conversion efficiency can be improved. It is recommended that the photovoltaic module of the present invention should have light transmittance in order to be used as a building integrated photovoltaic (BIPV) module applied to windows of a building.

Three methods may be largely used to permit the photovoltaic module to have light transmittance. The first method is to form a transmitting opening in the second electrode 130 when the second electrode 130 is formed of an opaque material. The transmitting opening at least passes through the second electrode 130, so that the entire photovoltaic module comes to have light transmittance.

A stack of the first electrode 110, the photoelectric conversion layer 120 and the second electrode 130 is, for example, divided into a plurality of unit cells around the photoelectric conversion layer 120 separated by a laser scribing method, and the plurality of the unit cells are in series connected to each other. In this case, the transmitting opening may be extended in a direction parallel with the series connection direction of the plurality of the unit cells. A ratio of the area of the formed transmitting opening to an entire photoelectric conversion area, i.e., the area of the formed photoelectric conversion layer 120 is referred to as an aperture ratio. The aperture ratio may be from 0% to 50%.

The second method is to form the second electrode 130 itself with a transparent conductive material like transparent conductive oxides (TCO), etc. The transparent conductive material may include, for example, at least one of $SnO_2$:F, ZnO:B, ZnO:Al, ITO, $TiO_2$, carbon nano tube (CNT). According to the second method, since the second electrode 130 cannot have reflectance relatively higher than that of the opaque conductive material, the entire photovoltaic module may not have a relatively higher photovoltaic conversion efficiency. However, the second electrode 130 has a light transmittance. Therefore, it is possible to obtain the light transmittance without formation of a separate transmitting opening.

The third method is to form the transmitting opening passing through the second electrode 130 as well as to form the second electrode 130 with the transparent conductive material. According to the third method, the second electrode 130 has a light transmittance and the transmitting opening is formed to obtain the light transmittance. As a result, the light transmittance of the photovoltaic module can be enhanced.

The photovoltaic module according to the embodiment of the present invention comes to have a light transmittance through one of the three methods mentioned above.

The insulating protective layer 140 according to the embodiment of the present invention may include one of etylene vinyl acetate (EVA), polyvinylfloride (PVF), polyvinyl butyral (PVB), an acrylic sheet or a back sheet. The insulating protective layer 140 is able to function as a binder between the second electrode 130 and the back substrate 150. Also, as described above, the optical layer 160 may be included in at least one of both sides of the insulating protective layer 140.

The back substrate 150 according to the embodiment of the present invention may be formed of a transparent glass substrate or a glass substrate having a predetermined color. The back substrate 150 may be also formed of materials such as a plastic material. Referring to Table 1 and FIG. 6, the back substrate 150 may have a transmittance of more than about 50% in all the wavelength ranges.

Hereafter, characteristics of a transmittance, a reflectance and an absorptance and a color coordinate of the photovoltaic module according to the embodiment of the present invention will be described.

Figure 8:
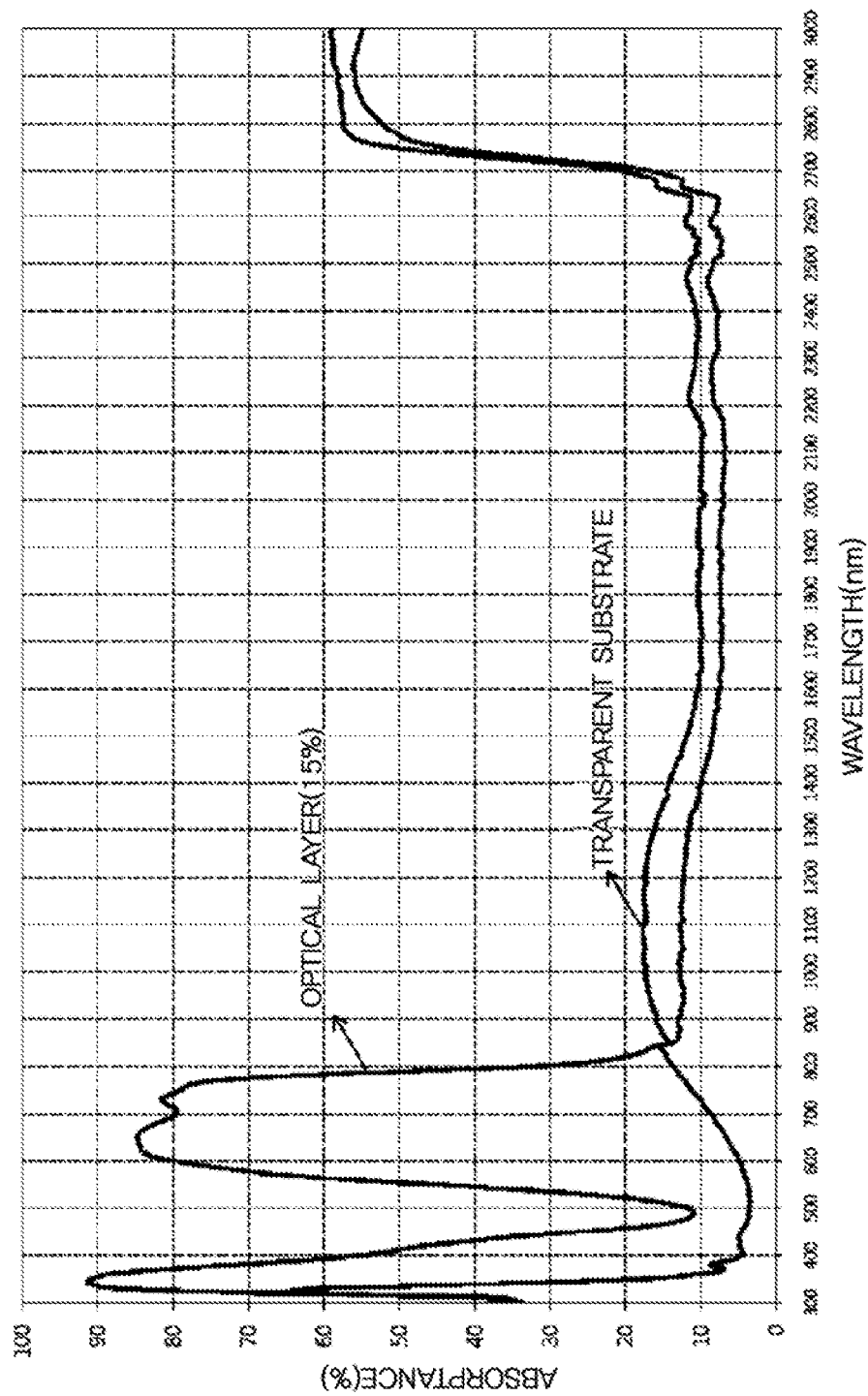
FIG. 8 is a graph showing a transmittance of the photovoltaic module according to the embodiment of the present invention.
Figure 9:
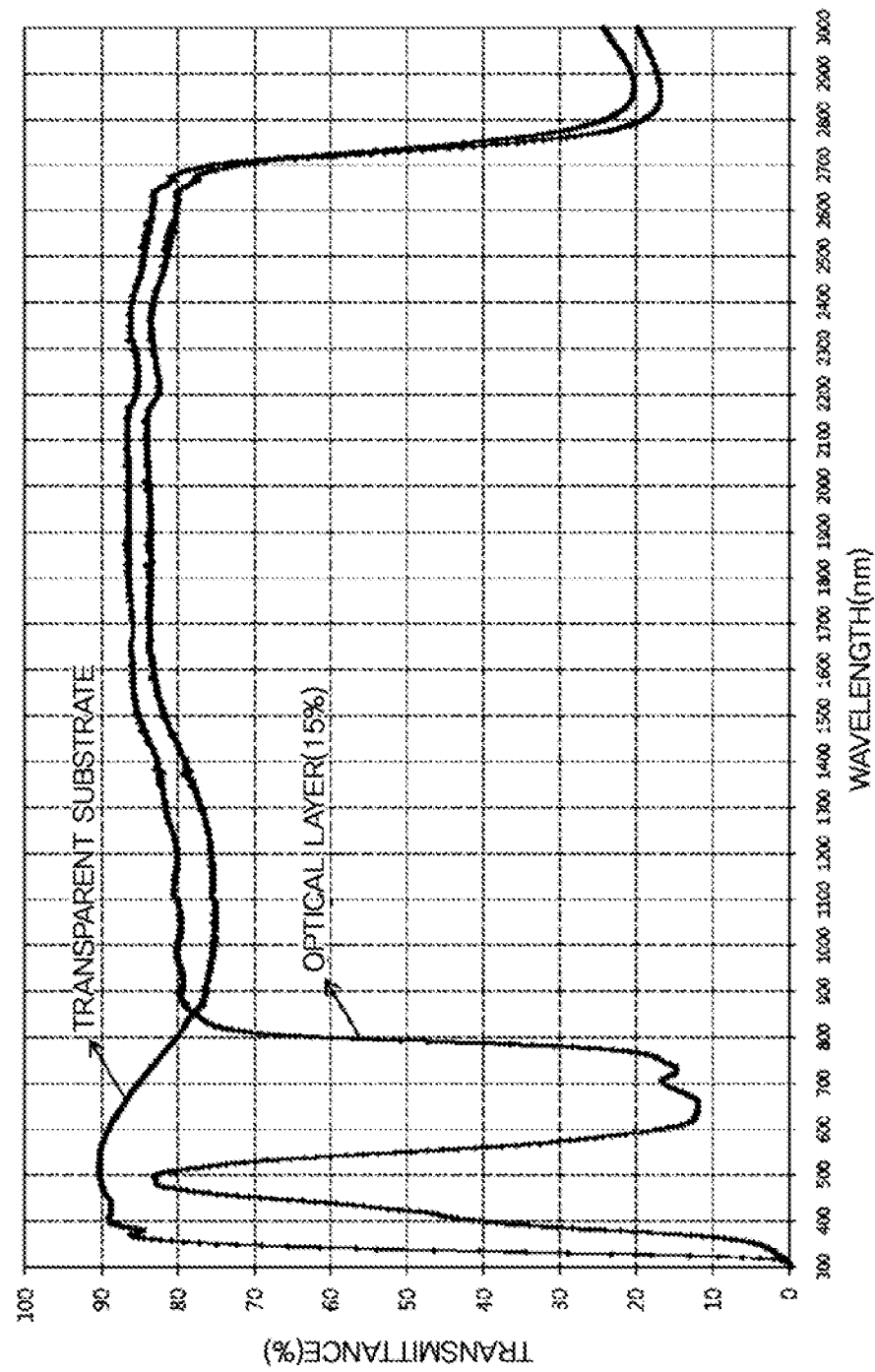
FIG. 9 is a graph showing an absorptance of the photovoltaic module according to the embodiment of the present invention.

Characteristics of a Transmittance, a Reflectance and an Absorptance of the Photovoltaic Module FIGS. 8 and 9 are graphs showing respectively a transmittance and an absorptance for each wavelength of the photovoltaic module according to the embodiment of the present invention.

Table 2 shows a transmittance, a reflectance and an absorptance for each wavelength of the photovoltaic module according to the embodiment of the present invention.

The transmittance, the reflectance and the absorptance of the photovoltaic module are measured under the conditions that the second electrode 130 is formed of a transparent conductive material, the aperture ratio is 0% and the optical layer 160 is included between the insulating protective layer 140 and the back substrate 150.

TABLE 2

| | Near UV (300 nm~400 nm) | | | Visible light (400 nm~800 nm) | | | Near IR (780 nm~3000 nm) | | |
|---|---|---|---|---|---|---|---|---|---|
| | transmittance | reflectance | absorptance | transmittance | reflectance | absorptance | transmittance | reflectance | absorptance |
| module A(10%) | 0 | 24.3 | 75.7 | 6.1 | 5.7 | 88.2 | 9.2 | 21.0 | 69.8 |
| module B(12%) | 0.1 | 25.3 | 74.6 | 6.0 | 5.9 | 88.1 | 8.9 | 21.4 | 69.7 |
| module C(13%) | 0 | 26.5 | 73.5 | 4.8 | 6.3 | 88.9 | 9.4 | 23.4 | 67.3 |
| module D(14%) | 0 | 23.6 | 76.4 | 4.6 | 5.4 | 90.0 | 9.6 | 21.3 | 69.1 |
| module E(15%) | 0 | 24.4 | 75.6 | 4.4 | 5.6 | 90.0 | 9.2 | 20.5 | 70.3 |
| module F(16%) | 0 | 26.6 | 73.4 | 4.1 | 6.0 | 89.9 | 9.5 | 21.9 | 68.7 |
| module G(17%) | 0 | 26.4 | 73.6 | 3.7 | 5.9 | 90.4 | 9.1 | 21.5 | 69.3 |
| module H(20%) | 0 | 23.3 | 76.7 | 3.3 | 5.6 | 91.0 | 8.9 | 21.0 | 70.1 |

In Table 2, 10%, 12%, 13%, 14%, 15%, 16%, 17% and 20% represent color depths of the optical layer 160 and mean that a weight ratio of a pigment or dye to a solvent in a solution used as a material of the optical layer 160.

Referring to Table 2 and FIG. 8, it can be found that the transmittance of the photovoltaic module is about 0% to 5% in the near UV region (300 nm~400 nm) and is about 5% to 15% in the near IR region (780 nm~3000 nm). Referring to Table 2 and FIG. 9, it can be found that the absorptance of the photovoltaic module is about 65% to 85% in the near UV region (300 nm~400 nm) and is about 60% to 80% in the near IR region (780 nm~3000 nm).

Meanwhile, as described above, the entire photovoltaic module may have a predetermined color due to the formation of the optical layer 160 and a unique color of the insulating protective layer 140 or the back substrate 150, etc.

Figure 10:
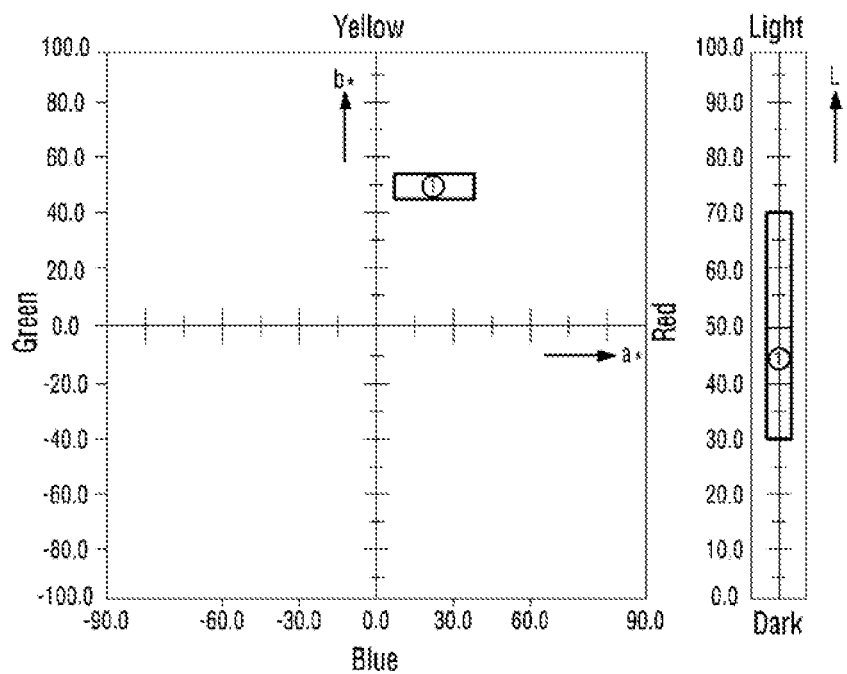
FIG. 10 is a graph showing a color coordinate of a unit cell according to the embodiment of the present invention.

FIG. 10 and Table 3 show a color coordinate of a unit cell of the photovoltaic module according to the embodiment of the present invention. The mentioned color coordinate corresponds to a Commission Internationale de l'Eclairage (CIE) LAB color coordinate. The CIE LAB color coordinate represents all the colors in the form of relative amounts of three extreme values of X, Y and Z and converts these numerical values into three coordinate values, that is, L*, a* and b*. Here, the L* represents a brightness variable. The a* and b* are chromaticity coordinates. The a* is concerned with an axis connecting Red with Green. The b* is concerned with an axis connecting Yellow with Blue.

When light having a wavelength of about 300 nm to about 1200 nm, which corresponds to a portion of solar spectrum, is irradiated to the unit cell, the color coordinate for the color of the unit cell is obtained by measuring the spectrum of the light transmitting through the unit cell. A light transmitting type equipment of a spectrophotometer (X-Rite color i5) is used as a measuring equipment of the light. The unit cell has a significant property of transmitting light therethrough rather than reflecting light. Since the visible color of the unit cell is caused by the spectral characteristics of the light transmitting through the unit cell, the color of the light transmitting through the unit cell is represented by the color coordinate. It can be said that the color of the unit cell corresponds to the measured color coordinate values, that is, color coordinate values measured for light transmitting through the unit cell in the visible light region (300 nm~800 nm) when the light having a wavelength of about 300 nm to about 1200 nm transmits through the unit cell.

TABLE 3

| unit | order | color coordinate | | |
|---|---|---|---|---|
| cell | 1 | L | a* | b* |
| | | 45.45 | 21.14 | 53.20 |

Referring to FIG. 10 and Table 3, it can be seen that the color of the unit cell according to the embodiment of the present invention is within a range of a*: 5~35, b*: 45~55, L*: 30~70 in the CIE LAB color coordinate. On the whole, it can be found that the unit cell of the photovoltaic module according to the embodiment of the present invention has a yellow based color.

Figure 11:
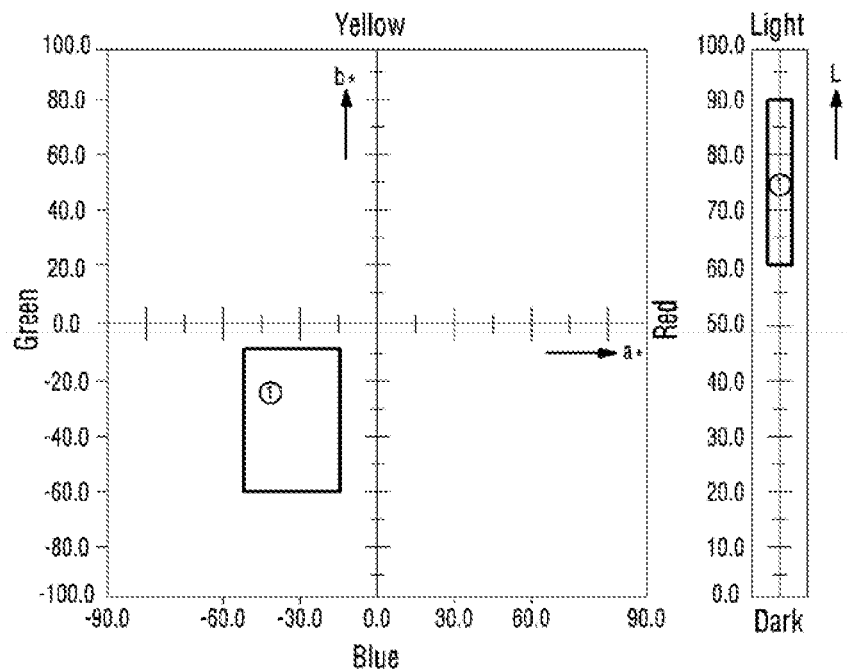
FIG. 11 is a graph showing a color coordinate of the optical layer according to the embodiment of the present invention.

Meanwhile, FIG. 11 and Table 4 show a color coordinate of the optical layer 160 according to the embodiment of the present invention. A measuring method of the color coordinate is the same as that of the unit cell.

TABLE 4

| transparent substrate + optical layer | order | color coordinate | | |
|---|---|---|---|---|
| (15%) | 1 | L* | a* | b* |
| | | 75.93 | −37.38 | −23.08 |

FIG. 11 and Table 4 show measurement results of the color coordinate after forming the optical layer 160 on one of both sides of a glass substrate. Since a transparent substrate is used as the glass substrate, it can be considered that the measured values of the color coordinate shown in FIG. 11 and Table 4 are the same as the color coordinate values of the optical layer 160 itself.

In Table 4, "15%" represents a color depth of the optical layer 160 and means that a weight ratio of a pigment or dye to a solvent in a solution used as a material of the optical layer 160 is 15%.

Referring to FIG. 11 and Table 4, it can be seen that the color of the optical layer 160 according to the embodiment of the present invention is within a range of a*: −50~10, b*: −60~10, L*: 60~90 in the CIE LAB color coordinate.

Figure 12:
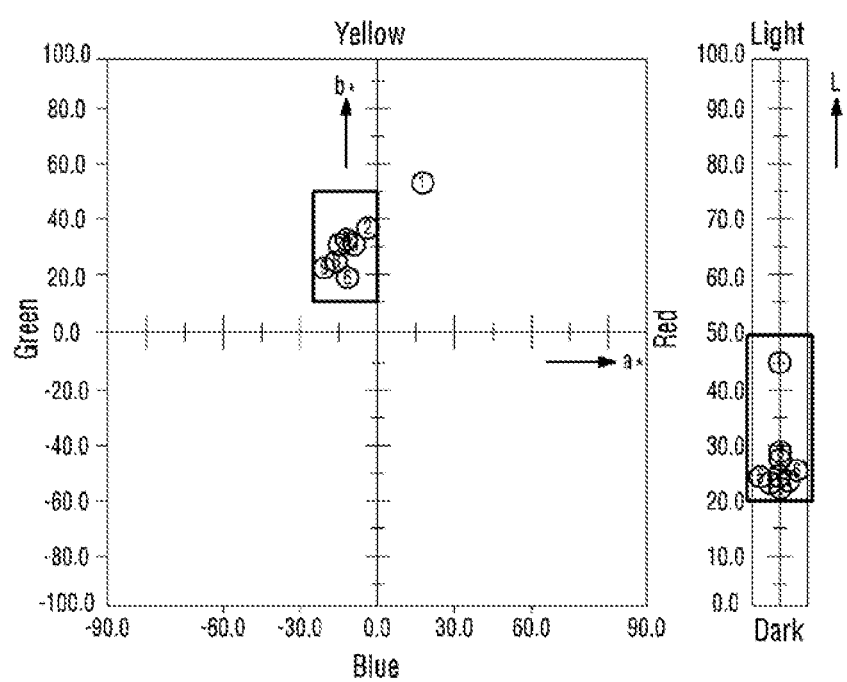
FIG. 12 is a graph showing a color coordinate of the photovoltaic module according to the embodiment of the present invention.

FIG. 12 and Table 5 show a color coordinate of the photovoltaic module according to the embodiment of the present invention. A measuring method of the color coordinate is the same as those of the unit cell and the optical layer.

| | order | component | color coordinate | | |
|---|---|---|---|---|---|
| | | | L* | a* | b* |
| photovoltaic module | 1 | transparent substrate | 45.83 | 18.24 | 51.19 |
| | 2 | module A(10%) | 26.64 | −1.09 | 39.34 |
| | 3 | module B(12%) | 27.41 | −7.44 | 31.16 |
| | 4 | module C(13%) | 24.66 | −11.07 | 34.17 |
| | 5 | module D(14%) | 24.75 | −9.84 | 34.75 |
| | 6 | module E(15%) | 26.34 | −12.80 | 19.18 |
| | 7 | module F(16%) | 24.24 | −15.07 | 32.16 |
| | 8 | module G(17%) | 24.12 | −16.52 | 25.70 |
| | 9 | module H(20%) | 22.12 | −18.08 | 23.22 |

In Table 5, "component" means components included in the photovoltaic module. The order of "1" means that a transparent substrate is included as a back substrate. The orders of "2" to "9" mean that the photovoltaic module includes the optical layer 160 having a predetermined color depth. Meanwhile, in Table 5, 10%, 12%, 13%, 14%, 15%, 16%, 17% and 20% represent color depths of the optical layer 160 and mean that a weight ratio of a pigment or dye to a solvent in a solution used as a material of the optical layer 160.

Referring to FIG. 12 and Table 5, it can be seen that the color of the photovoltaic module according to the embodiment of the present invention is within a range of as: −25~0, b*: 10~50, L*: 20~50 in the CIE LAB color coordinate.

When the photovoltaic module of the present invention is installed on the window of a building and the like, the photovoltaic module shows a color capable of reducing visual fatigue. As a result, as compared with a conventional photovoltaic module having a reddish brown color or an orange color and the like, the photovoltaic module of the present invention is able to alleviate the visual fatigue and to achieve high harmony and high beauty with the building.

Up to now, the exemplary embodiments of the present invention have been described. It can be understood by those skilled in the art that many alternatives, modifications, and variations of the present invention can be made without departing from the essential features of the present invention. Therefore, the disclosed embodiments are merely exemplary and are not to be construed as limiting the present invention. The scope of the present invention is shown in the appended claims and not in the foregoing descriptions. It should be construed that all differences within the scope equivalent to that of the claims are included in the present invention.

What is claimed is:

1. A photovoltaic module comprising:
   a first electrode formed on a substrate;
   a photoelectric conversion layer formed on the first electrode;
   a second electrode formed on the photoelectric conversion layer; and
   a light transmitting back substrate disposed over the second electrode, and
       having a color within a range of a*: −25~0, b*: 10~50, L*: 20~50 in Commission Internationale de l'Eclairage (CIE) LAB color coordinate.

2. The photovoltaic module of claim 1, further comprising:
   an insulating protective layer formed between the second electrode and the back substrate; and
   an optical layer being formed at least one of under the substrate, between the substrate and the first electrode, between the second electrode and the insulating protective layer, between the insulating protective layer and the back substrate, and on the back substrate, and showing a color.

3. The photovoltaic module of claim 2, wherein the optical layer is formed from a solution of which a weight ratio of a coloring pigment or dye to a solvent is 5% to 40%.

4. The photovoltaic module of claim 2, wherein the color of the optical layer is within a range of a*: −50~−10, b*: −60~−10, L*: 60~90 in the CIE LAB color coordinate.

5. The photovoltaic module of claim 2, wherein the transmittance of the optical layer is 5% to 40% in the near UV region and is 50% to 80% in the near IR region.

6. The photovoltaic module of claim 2, wherein the absorptance of the optical layer is 50% to 80% in the near UV region and is 10% to 25% in the near IR region.

7. The photovoltaic module of claim 1, wherein the transmittance of the photovoltaic module is 0% to 56% in the near UV region and is 5% to 15% in the near IR region.

8. The photovoltaic module of claim 1, wherein the absorptance of the photovoltaic module is 65% to 85% in the near UV region and is 60% to 80% in the near IR region.

9. The photovoltaic module of claim 1, wherein the second electrode comprises at least a transmitting opening which is formed in and passes through the second electrode.

* * * * *